May 27, 1969 S. J. ZUERKER 3,446,920

TRANSISTOR AMPLIFIER CIRCUIT FOR PIEZO-ELECTRIC PHONOGRAPH CARTRIDGE

Filed Oct. 21, 1964

INVENTOR:
SIEGFRIED J. ZUERKER,

BY Norman C. Fulmer
HIS ATTORNEY.

United States Patent Office
3,446,920
Patented May 27, 1969

3,446,920
TRANSISTOR AMPLIFIER CIRCUIT FOR PIEZO-ELECTRIC PHONOGRAPH CARTRIDGE

Siegfried J. Zuerker, Utica, N.Y., assignor to General Electric Company, a corporation of New York Filed Oct. 21, 1964, Ser. No. 405,364
Int. Cl. G11b 3/00
U.S. Cl. 179—100.4 1 Claim

ABSTRACT OF THE DISCLOSURE

A transistor amplifier circuit for a piezo-electric phonograph cartridge, the circuit including first and second capacitors respectively connected between the base and emitter electrodes and base and collector electrodes of the transistor to substantially match the impedance of the cartridge to the transistor while reducing the noise at the output thereof.

This invention relates to phonograph amplifiers, and particularly to transistor amplifiers for piezo-electric type phonograph pickup cartridges.

Various problems arise in designing a transistor amplifier for a piezo-electric phonograph cartridge. For example, this type of cartridge is a relatively high impedance device (typically in the megohms at 100 cycles per second) whereas a transistor is a relatively low impedance device (typically about 1,000 ohms), thus causing a problem in impedance matching in order to obtain proper audio frequency response. Another problem is created by undesirable noise generated in the transistor amplifier. A further problem with these cartridges in the limitation on permissible length of the shielded wire customarily connected between the cartridge and the amplifier, this shielding being necessary because of the high impedance and the low amplitude output signal of the device. If the length of this shielded connecting wire is too great, its capacitance adversely affects the strength of the signal.

An object of the invention is to provide an improved transistor amplifier circuit for piezo-electric type phonograph cartridges.

Another object is to provide an improved transistor amplifier circuit which overcomes the above-described problems encountered in such a circuit.

A further object is to provide an improved circuit of the type described, which is simple and economical to manufacture.

Other objects will be apparent from the following description and claim, and from the accompanying drawing.

The piezo-electric phonograph pickup transistor amplifier circuit of the invention comprises, basically and in its preferred embodiment, a transistor connected in the common emitter configuration, means biasing the transistor for amplifier operation, means for connecting the base electrode of the transistor to a ceramic-type phonograph cartridge, and a capacitor connected between the base electrode and a point of reference potential so as to be effectively in electrical parallel with the phonograph cartridge, this capacitor having a value of capacitance sufficiently large to achieve the objects of the invention. Preferably, the value of this capacitor is such that its capacitive reactance is equal to the transistor effective input impedance at a low frequency in the audio frequency range, for example at a frequency of about 50 to 100 cycles per second.

Figure 1:
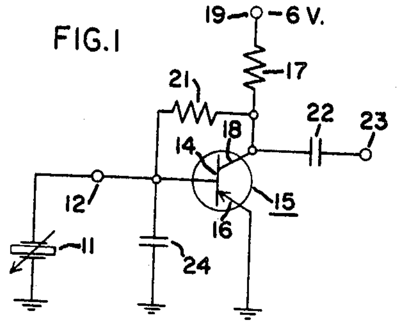
Figure 2:
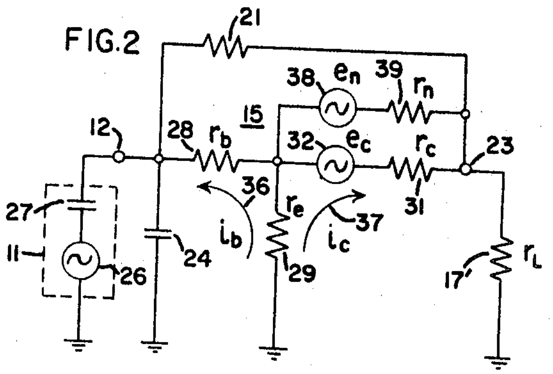
Figure 3:
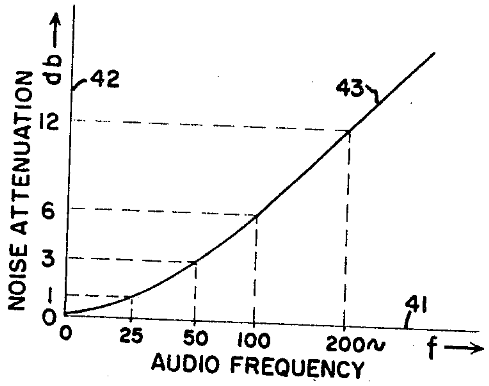
Figure 4:
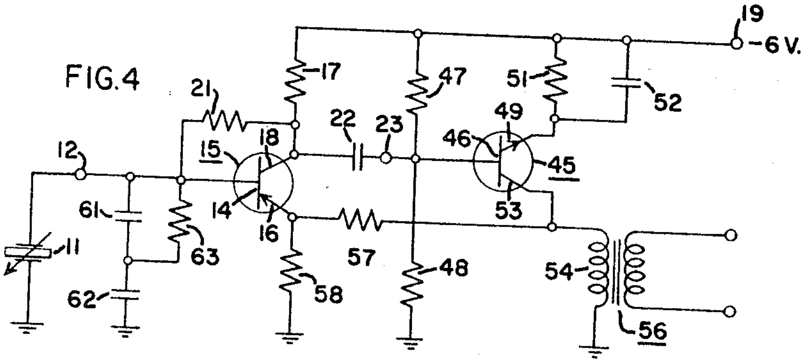
Figure 5:
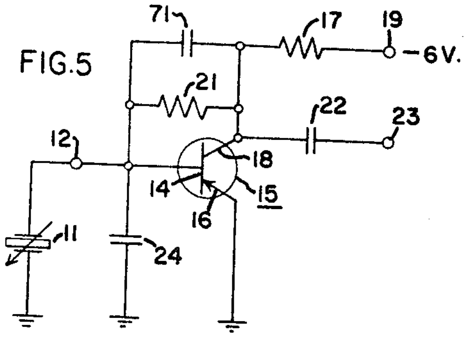

In the drawing, FIGURE 1 is an electrical schematic circuit diagram of a preferred embodiment of the invention, FIGURE 2 is an equivalent electrical circuit of the circuit of FIGURE 1, in order to illustrate the functioning of the invention, FIGURE 3 is a plot of noise attenuation achieved by the invention, versus audio frequency, FIGURE 4 is an electrical schematic circuit diagram of an alternative embodiment of the invention, and FIGURE 5 is an electrical schematic circuit diagram of a further alternative embodiment of the invention.

Now referring to FIGURE 1, a piezo-electric phonograph pickup cartridge 11 is connected between electrical ground and an input terminal 12 of a transistor amplifier circuit. The transducer element of the pickup cartridge 11 may comprise any suitable piezo-electric material, such as a ceramic (barium titanate, for example) or a crystal (Rochelle salt crystal, for example).

The base electrode 14 of an amplifier transistor 15 is connected to the amplifier input terminal 12, and the emitter electrode 16 of this transistor is connected to electrical ground. A load resistor 17 is connected between the collector electrode 18 of the transistor 15, and a terminal 19 of operating voltage, shown in the example as being 6 volts of negative polarity. A base biasing resistor 21 is connected between the base and collector electrodes 14 and 18. A signal coupling capacitor 22 is connected between the collector electrode 18 and a signal output terminal 23 of the amplifier. One or more additional amplifier stages customarily are connected to the terminal 23.

As thus far described, the aforementioned problems of amplifier circuit design arise, primarily due to the relatively high impedance of the piezo-electric pickup cartridge 11 as contrasted with a relatively low input impedance of the transistor 15. It has been common practice to insert a resistor between the signal input terminal 12 and the base electrode 14, in order to improve the impedance matching between cartridge 11 and the base electrode 14 of the transistor 15. By thus improving the impedance match, the frequency characteristic of the phonograph signal is improved, i.e., the amplitude of the signal is substantially uniform over the audio frequency range, whereas without the impedance matching technique, the lower audio frequencies would become substantially reduced due to impedance mismatching. However, it is found that when this technique is employed, the noise generated in the transistor 15 is a severe problem.

In accordance with the present invention, a capacitor 24 is connected in the amplifier circuit in parallel with the phonograph cartridge 11, i.e., in the example shown, this capacitor is connected between the base electrode 14 and electrical ground. The value of this capacitance 24 is sufficiently great so that proper impedance matching is achieved between the high impedance cartridge 11 and the low impedance base input circuit of the transistor 15, and also the amount of noise generated in a transistor 15 is substantially reduced as will be explained. Furthermore, the capacitor 24, being in shunt with the cartridge 11, permits the use of a long length of shielded cable between the cartridge 11 and the signal input terminal 12, since any shunt capacitance introduced in the input circuit by the shielded connection, is relatively small compared to the value of the shunt capacitor 24.

The functioning of the invention will now be explained, with reference to the equivalent electrical circuit diagram shown in FIGURE 2. The phonograph cartridge 11 is the equivalent of a voltage generator 26 connected in series with a capacitor 27 having a capacitance value, for example, of 500 micro-microfarads. The transistor 15, in its equivalent circuit, comprises a base resistance 28, an emitter resistance 29, and a collector resistance 31 in series with an amplified signal generator 32. A load resistance 17' comprises the load resistor 17, in parallel with whatever impedance is connected across the output terminal 23 and electrical ground. In the transistor 15, a base current 36 flows through the emitter resistance 29 and the base resistance 28, and a collector currrent 37 flows through the emitter resistance 29 and the collector resistance 31. Also, a noise signal generator 38, which inherently exists in the transistor 15 due to the characteristics thereof, is connected in series with a noise resistance 39, across the equivalent amplified signal generator 32 and collector resistance 31.

The noise from the noise generator 38, which occupies substantially the entire audio frequency range, flows through the load impedance 17', and also flows in part through the emitter resistance 29 and in part through the base resistance 28 and impedance of the parallel connected capacitor 24 and pickup cartridge 11. Whatever noise current flows through the emitter resistance 29, becomes amplified by the transistor in the equivalent amplified signal generator 32, and appears as an undesired component at the output terminal 23. Since the impedance of the pickup cartridge 11 is quite high with respect to the emitter resistance 29, very little noise current flows through the cartridge 11. However, a substantial amount of the noise signal flows through the capacitor 24, and is thus diverted from the emitter resistance 29 thereby appreciably reducing the internally generated transistor noise which appears at the output terminal 23.

A preferred value of capacitance for the capacitor 24, is such that the capacitive reactance of this capacitor is approximately equal to the effective emitter resistance, which is the resistance 29 multiplied by beta, plus $r_b$ at a low frequency. Thus, approximately half of the noise current flows through the capacitor 24 and the other half through the emitter resistance 29 at this low frequency, for example 100 cycles. Thus, the amount of noise is attenuated by 6 decibles at this low audio frequency, and the noise is more greatly attenuated with increasing audio frequency, since the capacitive reactance of capacitor 24 is lower at higher frequencies.

FIGURE 3 is a plot of the noise attenuation thus achieved by the invention, assuming that the capacitor has a value so that its capacitive reactance at 100 cycles is equal to the effective emitter resistance plus $r_b$. The horizontal axis 41 represents audio frequency, the vertical axis 42 represents noise attenuation, and the curve 43 represents the noise attenuation vs. frequency achieved by the invention. As shown in FIGURE 3, the noise attenuation with be 3 db at 50 cycles, 6 db at 100 cycles, 12 db at 200 cycles, and thereafter increases 6 db with every doubling of frequency. A practical value of capacitance for the capacitor 24, in accordance with the foregoing illustration, will be 0.5 microfarad if the pickup cartridge capacitance 27 has a value of 500 micro-microfarads.

In addition to achieving the foregoing attenuation of noise in the transistor amplifier, the capacitor 24 achieves impedance matching between the high impedance cartridge 11 and the low base input impedance of the transistor 15, since the capacitors 27 and 24 function as an impedance dividing or matching network. This network has an impedance ratio of one thousand to one in the foregoing example. This, of course, reduces the amplitude of signal aplied to the base electrode 14 from the cartridge 11, but no more so than in the case of the conventional practice of connecting a series resistor between the pickup cartridge and transistor amplifer in order to achieve proper impedance matching.

FIGURE 4 is a schematic diagram of a complete audio amplifier, in accordance with an embodiment of the invention, in which a second amplifier transistor 45 has a base electrode 46 connected to the aforesaid output terminal 23, there being biasing resistors 47 and 48 respectively connected between the base electrode 46, and the voltage terminal 19 and electrical ground. An emitter electrode 49 is connected to the voltage terminal 19 by means of a parallel-connected resistor 51 and capacitor 52, and a collector electrode 53 is connected to electrical ground via a primary winding 54 of an output transformer 56. A signal feedback resistor 57 is connected between the collector electrode 53 of the second transistor 45, and the emitter electrode 16 of the first amplifier transistor 15, there being a resistor 58 connected between this emitter electrode 16 and electrical ground. The negative feedback provided by the resistor 57, somewhat increases the input impedance of the first transistor 15, thereby aiding in impedance matching of the base input of this transistor with respect to the pickup cartridge 11 and permitting a reduction in value of the shunt capacitor of the invention insofar as impedance matching is concerned.

Instead of a single capacitor such as the capacitor 24 in FIGURE 1 for achieving the objects of this invention, in FIGURE 4 two capacitors 61 and 62 are connected in series between the input terminal 12 and electrical ground, and a resistor 63 is connected across the condenser 61. The values of capacitors 61 and 62 are chosen so that the combined series capacitance is of a value for achieving the objects of the invention as described above, and the ratio of capacitance values between capacitors 61 and 62 are chosen, in combination with the value of resistor 63, so as to achieve signal equalizing or compensating effect by the networks 61, 62, and 63, in order to provide proper electrical compensation for the standard recording pre-emphasis as well as for the cartridge characteristics. Suitable values for these elements have been found to be as follows:

| | | |
|---|---|---|
| Capacitor **61** | microfarads | 0.015 |
| Capacitor **62** | do | 0.05 |
| Resistor **63** | ohms | 5,600 |
| Feedback resistor **57** | do | 68,000 |
| Emitter resistor **58** | do | 47 |
| Base biasing resistor **21** | do | 470,000 |

In the alternative embodiment of FIGURE 5, the circuit is the same as for FIGURE 1, except that an additional capacitor 71 is connected between the base electrode 14 and the collector electrode 18. This capacitor 71 provides frequency selective feedback from collector to base electrodes, thereby tending to boost the lower audio frequencies amplified by the circuit, and also functioning in part, or entirely if desired and if permitted by the circuit design, the functions achieved by the condenser 24. That is, the effective capacitance of condenser 71, which is actual capacitance times the voltage gain between base and collector, is effectively in shunt with the pickup cartridge 11. Whatever amount of effective shunt capacitance the capacitor 71 provides across the pickup cartridge 11, the value of capacitor 24 may be accordingly reduced, and may even be eliminated if the capacitor 71 has a sufficiently large value.

By providing the relatively inexpensive capacitor 24 as shown in FIGURE 1, or its alternative equivalents as illustrated in FIGURES 4 and 5, the objects of the invention have been achieved in a simple, economical, and reliable manner.

What I claim is:

1. A piezo-electric phonograph transistor amplifier comprising a transistor having base, emitter and collector electrodes, means adapted for connecting a piezo-electric phonograph cartridge across said base and emitter electrodes, said cartridge having an impedance greater than the transistor amplifier input impedance between said base and emitter electrodes, signal output means connected to said collector electrode, said transistor having the characteristic of producing undesired noise at said signal output means, a first capacitor connected between said base and emitter electrodes, and a second capacitor connected between said base and collector electrodes to provide signal feedback and providing a value of capacitance effectively between said base and emitter electrodes in parallel with said first capacitor, said first and second capacitors having values of capacitance such that their combined parallel effective capacitance between said base and emitter electrodes substantially matches the impedance of the cartridge to the amplifier while reducing the amount of said noise at the signal output means.

References Cited

UNITED STATES PATENTS 2,822,430 2/1958 Lin -------------- 179—100.4

OTHER REFERENCES

Lin, Transistor Input Stage for Phonograph Pickups, J. of the Audio Eng. Soc., vol. 4, October 1956, pp. 168–175.

BERNARD KONICK, *Primary Examiner.*

RAYMOND F. CARDILLO, Jr., *Assistant Examiner.*